(12) United States Patent
Foltz et al.

(10) Patent No.: US 12,316,324 B2
(45) Date of Patent: May 27, 2025

(54) FREQUENCY MATCHED SUB-SAMPLE FEEDFORWARD MODULATION IN AMPLITUTE LEVEL CONTROL LOOP

(71) Applicant: Keysight Technologies, Inc., Santa Rosa, CA (US)

(72) Inventors: Garrett Foltz, Santa Rosa, CA (US); Michael S. Foster, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 66 days.

(21) Appl. No.: 18/210,121

(22) Filed: Jun. 15, 2023

(65) Prior Publication Data

US 2024/0056064 A1 Feb. 15, 2024

Related U.S. Application Data

(60) Provisional application No. 63/398,016, filed on Aug. 15, 2022.

(51) Int. Cl.
*H03K 5/01* (2006.01)
*H03H 21/00* (2006.01)

(52) U.S. Cl.
CPC ........... *H03K 5/01* (2013.01); *H03H 21/0012* (2013.01)

(58) Field of Classification Search
CPC .............................. H03K 5/01; H03H 21/0012
See application file for complete search history.

(56) References Cited

U.S. PATENT DOCUMENTS

| 7,026,873 | B2* | 4/2006 | Shanbhag | H03F 1/3247 |
| | | | | 330/149 |
| 8,310,304 | B1 | 11/2012 | Vagher et al. | |
| 9,813,038 | B2 | 11/2017 | Liao et al. | |
| 2004/0240538 | A1* | 12/2004 | Abrishamkar | H04L 25/03057 |
| | | | | 375/233 |
| 2004/0264552 | A1* | 12/2004 | Smee | H04L 25/03063 |
| | | | | 375/147 |
| 2012/0052892 | A1* | 3/2012 | Braithwaite | H04B 1/48 |
| | | | | 455/501 |

\* cited by examiner

*Primary Examiner* — Sibin Chen

(57) ABSTRACT

An automatic level control (ALC) circuit includes an input configured to receive a radio frequency (RF) input signal, a level control circuit coupled to the input and configured to control a level of the RF input signal in response to a feedback signal, and an output coupled to the level control circuit and configured to output a level-controlled RF output signal. The ALC circuit further includes a feedback path coupled to the output and configured to sample the level-controlled RF output signal to determine an error detected in the level-controlled RF output signal, and to generate the feedback signal in accordance with the error. The ALC circuit still further includes a feedforward path coupled to the input and configured to emulate a frequency response in the feedback path and to adjust the error determined in the feedback path according to the emulated frequency response.

9 Claims, 8 Drawing Sheets

FREQUENCY MATCHED SUB-SAMPLE FEEDFORWARD MODULATION IN AMPLITUTE LEVEL CONTROL LOOP

CROSS-REFERENCE TO RELATED APPLICATIONS

The present application claims priority under 35 U.S.C. § 119(e) to U.S. Provisional Application No. 63/336,009, filed on Aug. 15, 2022. The entire disclosure of U.S. Provisional Application No. 63/336,009 is specifically incorporated herein by reference in its entirety.

BACKGROUND

A signal generator may be equipped with an amplitude level control (ALC) loop that is configured to level a power of a radio-frequency (RF) signal output from the signal generator. For example, the ALC loop may be utilized to hold an output power at a desired level in spite of power fluctuations that would otherwise be caused due to temperature variations and other factors. In other words, the ALC loop compensates for the effects of ambient conditions on output power.

FIG. 1 is a simplified circuit diagram for reference in explaining an ALC loop of an example of the related art. Referring to FIG. 1, an RF signal source 10 outputs an RF signal that is applied to the input of a variable gain amplifier/attenuator circuit 11. The output signal of the variable gain amplifier/attenuator circuit 11 is passed through a directional coupler 12 and output as an RF output signal. In addition, a small portion of the output signal from the variable gain amplifier/attenuator circuit 11 is diverted to a power detector 13. The power detector 13 is configured to measure a signal parameter correlating to the power of the RF output signal, and the thus measured signal parameter is applied to an ALC circuit 14. The ALC circuit 14 compares the measured signal parameter of the RF output signal to a given Setpoint 15 to generate an error signal. The Setpoint 15 may be a user programmable value indicative of a desired output power. The error signal of the ALC circuit 14 is used to drive the variable gain amplifier/attenuator circuit 11 to adjust the power of the RF output signal in a direction which will reduce the magnitude of the error signal. Using well-know feedback principles, the output power of the RF output signal will be made to match that indicated by the Setpoint.

FIG. 2 is circuit diagram for reference in explaining an ALC loop of another example of the related art. FIG. 2 represents a typical prior art automatic level control circuit for use with RF sources. The circuit functions to produce an output 111 with a controlled amplitude (or power). RF power is generated by a conventional generator 100 which may illustratively be an oscillator, magnetron or semiconductor oscillator. The output power from the oscillator 100 is provided via transmission line 102 which may be, for example, a microstrip line, waveguide or other transmission arrangement to power amplifier 104. If both oscillator 100 and power amplifier 104 are broadband devices, RF power can be produced over a wide range of frequencies. However, generally the output of amplifier 104 will not have constant amplitude over the entire range.

Accordingly, the output of amplifier 104 is provided to a conventional linear modulator 106. The output of modulator 106 is, in turn, provided to buffer amplifier 108, directional coupler 110 and finally to the output 111. Consequently, the output amplitude at output 111 can be controlled directly by the linear modulator 106. Modulator 106, in turn, is controlled by a feedback loop in which the major components consist of a detector 112, amplifier 114, integrator 121 and amplifier 124.

More particularly, directional coupler 110 samples a small fraction of the output power and diverts the sample to a conventional detector 112 which is shown schematically as a diode. Detector 112 converts the RF output power to a DC voltage which is provided to a buffer amplifier 114. Generally, amplifier 114 is a logarithmic amplifier or log amplifier for several reasons. Generally, a log amplifier increases the dynamic range over which the RF amplitude can be controlled and keeps the feedback loop gain constant even though the gain of the RF generator and amplifier may vary considerably with frequency. Finally, a log amplifier allows correction of any non-linearities in detector 112 by using a multiple-slope breakpoint amplifier. In addition, a log amplifier allows the reference level to be easily calibrated in decibels.

The output of amplifier 114 is provided to the positive input of summing point 116 which is associated with integrator 121. At summing point 116, the output voltage is summed with a reference level voltage provided on line 131. This reference voltage is used to set the output level of the circuit.

The difference between the analog output voltage produced by amplifier 114 and the reference level voltage is an error signal which is provided, via resistor 122, to integrator 121. As shown in FIG. 2, an illustrative analog integrator is a conventional operational amplifier integrator consisting of capacitor 120 and operational amplifier 118.

The integrated error signal produced at the output of integrator 121 is provided to exponential amplifier 124 which reverses the scaling effects of log amplifier 114, and the resulting output of amplifier 124 is used as a control voltage for linear modulator 106. In accordance with well-known feedback theory, during steady-state operation, the error voltage developed at summing point 116 is driven to zero by the operation of the feedback loop.

The above-described system can also be used in a straightforward manner for amplitude modulation. In particular, the reference signal on line 131 can be amplitude modulated by combining a stable level reference voltage from source 136 and amplitude-modulation signal on line 134 by means of summing point 130. Generally, it is desirable that the modulation be linear so that the envelope of the modulated RF signal at output 111 has the same shape as the modulating signal on line 134. Consequently, the modulation input on line 134 is generally processed through a logarithmic amplifier 132 before being summed with the reference level voltage at summing point 130. The action of the feedback loop described above will then force the output RF amplitude at point 111 to follow the modulating input at input 134 with reasonably good fidelity within the dynamic range and bandwidth limitations of the feedback loop. The amplitude-modulated "carrier" or base level can be set by changing the reference voltage level on line 136 in a conventional manner.

Regardless of the particular configuration, ALC loops generally have a characteristic bandwidth (BW) such that any measured error inside that loop BW is attenuated. A technique is known in the art in which "Feedforward" of intended modulation inside the loop BW stops the cancellation of the intended modulation by the control loop while maintaining a level output power. This technique is used, for example, with pulse and sine amplitude modulation for analog source products, and has been extended to work with digital IQ modulation as well.

However, prior feedforward techniques do not allow for leveling of pulse modulation below the sample rate of a feedback path. As such, for example, if a source product was required to level 30 ns pulses, a 100 MS/s analog-to-digital conversion (ADC) may be needed. This is because the rising and falling edges of the pulse would be invalid transitions to level on, leaving only one 10 ns interval to sample the pulse.

Additionally, prior feedforward techniques make no attempt to match the frequency response of intended modulation fed forward to the control loop, causing output modulation correlated and frequency dependent error to multiply with the output, which causes distortion. The only way to mitigate this is to lower the bandwidth of the ALC loop.

SUMMARY

An automatic level control (ALC) circuit includes a modulation input configured to receive a modulation input signal, and a level control circuit coupled to the modulation input and configured to control a level of a radio-frequency (RF) output signal in response to a feedback signal, the RF output signal modulated according to the modulation signal. The ALC circuit further includes an output coupled to the level control circuit and configured to output the RF output signal, and a feedback path coupled to the output and configured to sample the RF output signal to determine an error detected in the RF output signal, and to generate the feedback signal in accordance with the error. The ALC circuit further includes a feedforward path coupled to the modulation input and configured to emulate a frequency response in the feedback path and to adjust the error determined in the feedback path according to the emulated frequency response.

A sampling rate of feedback path may be less than signal rate of the modulation input signal.

The feedforward path may include an adaptive filter, such as a least-mean-square (LMS) adaptive filter. The feedforward path may further include a squaring circuit coupled between the input and an input of the LMS adaptive filter, and a multiplier circuit connected to an output LMS adaptive filter. The feedforward path is implemented in a field programmable gate array (FPGA).

The feedback path may include a detector coupled to the output and configured to detect a power of the RF output signal, an analog-to-digital converter configured to digitize an output of the detector, and a detector conditioning circuit configured to linearize the output of the detector relative to a power of the RF output signal.

The ALC circuit may further include a summing circuit configured to sum an output of the multiplier and an output of the feedward path, wherein an output of the summing circuit corresponds to the error as adjusted by the feedward path.

A modulation scheme used to modulate the RF output signal may be one of analog modulation, digital modulation and IQ modulation.

BRIEF DESCRIPTION OF THE DRAWINGS

The above and other aspects and features of the inventive concepts will be described in the detailed description that follows, with reference to the accompanying drawings, in which.

DETAILED DESCRIPTION

Figure 1:
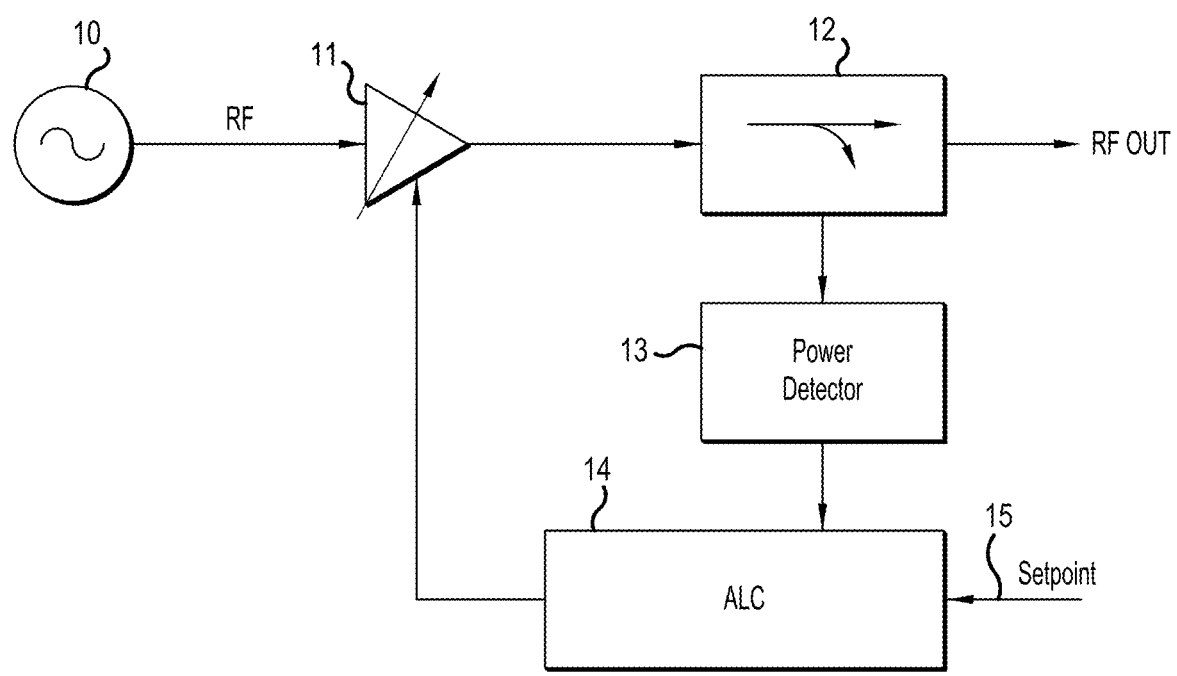
FIG. 1 is a circuit diagram for reference in describing an example of an automatic leveling control (ALC) loop according to the related art.
Figure 2:
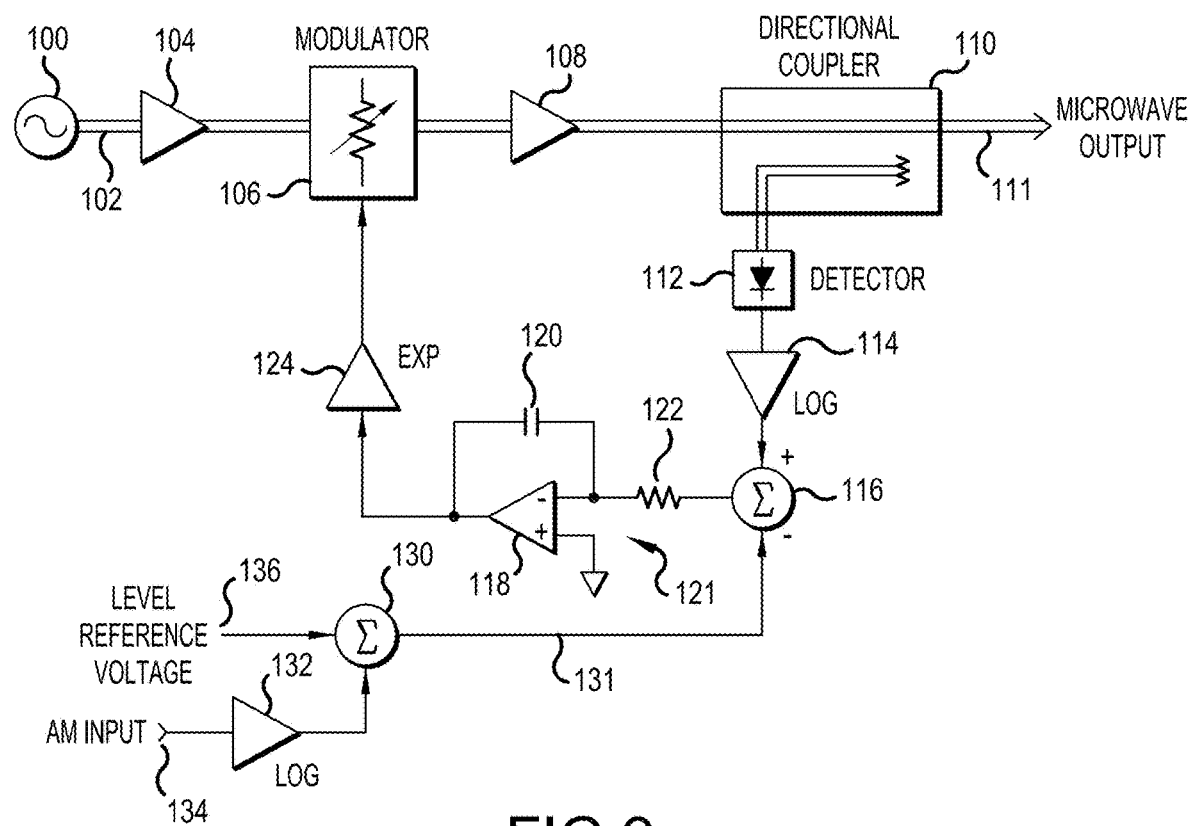
FIG. 2 is a circuit diagram for reference in describing another example of an ALC loop according to the related art.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Embodiments of the inventive concepts are directed to automatic leveling control (ALC) loops including a calibrated feedforward path matching the frequency response of a feedback loop. Matching the feedback frequency response eliminates the modulation correlated error and allows for leveling of pulse modulation below the sample rate of the feedback path. This allows for higher precision, lower rate ADCs to be used for enhanced dynamic range and accuracy of the leveling loop. This calibration of the feedforward modulation can be done "offline" via memory captures, or real-time in, for example, a field programmable gate array (FPGA) via an adaptive least-mean-squares (LMS) filter.

Figure 3:
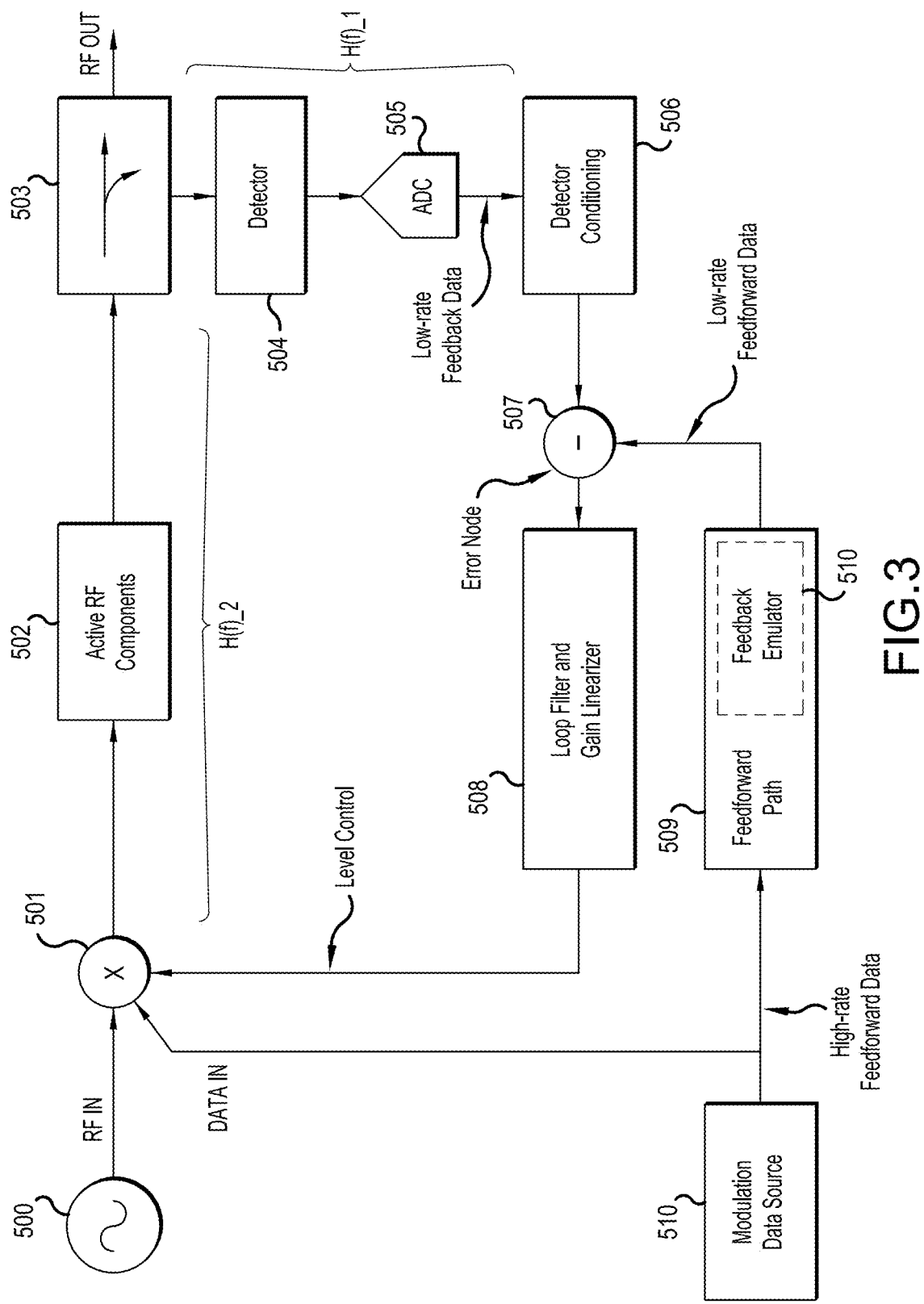
FIG. 3 is a circuit diagram for reference in describing an ALC loop according to an embodiment of the inventive concepts.

FIG. 3 is a circuit block diagram illustrating an ALC circuit according to an embodiment of the inventive concepts. It will be understood that the ALC circuit may include other components and elements not shown in FIG. 3 that may not be central to the inventive concepts. As one example only, the active RF components (discussed below) may include RF frequency up-conversion components.

Referring to FIG. 3, a modulation data source 511 generates modulation data (or signals) (DATA IN). Generally, a radio-frequency (RF) source signal may be modulated or synthesized according to the modulation data source 511. The modulation scheme is not limited, and can be any of analog modulation, digital modulation and IQ modulation. These are generically represented in FIG. 3 by the RF input signal (RF IN) and the modulation data being applied as inputs to a level control circuit 501 (such as, for example, a variable gain amplifier/attenuator circuit). The level control circuit 501 is configured to control a level of an RF output signal (RF OUT) in response to the modulation data and a feedback signal ("level control" in FIG. 3). The output of the level control circuit 501 may applied to other active RF components 502 which may include signal lines and other components and circuits. For example, the active RF components may include circuits for synthesis to RF frequencies using an RF source 500 of some kind. Such circuits may include mixers, high speed DACs, amplifiers, an oscillator, and so on. As another example, the active RF components 502 may include a highspeed IF DAC that outputs IQ modulation at RF center frequencies. It is noted here that while the RF input signal is shown in FIG. 3 as being applied to the level control circuit 501, this is merely for illustrative purposes. Instead, the RF input signal may be generated among and applied to the active RF components in which the RF output signal is synthesized. The resultant RF signal from the active RF components 502 is passed through a directional coupler 503 and output as an RF output signal (RF OUT).

A feedback path may be established using the directional coupler 503 to divert a small portion of the RF output signal to a power detector 504. The feedback path is configured to sample the level-controlled RF output signal to determine an error detected in the level-controlled RF output signal, and to generate the feedback signal in accordance with the error. In the example of FIG. 3, the feedback path includes the power detector 504 configured to measure a signal parameter correlating to the power of the RF output signal. The thus measured signal parameter is applied to an analog-to-digital (ADC) circuit 505 which converts the measured signal parameter of the RF output signal to a digital signal.

In an embodiment, the sampling rate of the ADC 505 is less than a sample rate of the modulation signal. For context, an example of the sample rate of the modulation signal is 112.5 MS/s, and an example of the sampling rate of the ADC 505 is 14.0625 MS/s. As a result, "low-rate" feedback data indicative of the measured signal parameter of the RF output signal is generated by the ADC 505.

Referring still to the example of FIG. 3, the low-rate feedback data output by the ADC 505 is applied to a detector conditioning circuit 506. It is noted here that the output of the power detector 504 may not be linear. That is, the output voltage of the power detector 504 may not be linear relative to the detected RF output signal power. The detector conditioning circuit 506 is configured to linearize the response of the power detector 504. In this manner, a linear change of detected power is reflected as a linear change in the output of the detector conditioning circuit 506.

The output of the detector conditioning circuit 506 is applied to an error node where it is compared to (or subtracted from) a value derived in a feedforward path. In the example of FIG. 3, this value is supplied at the output of a feedback path 509. The feedback path 509 is configured to "Feedforward" an intended modulation inside the loop bandwidth to stop the cancellation of the intended modulation by the control loop while maintaining a level output power.

In an embodiment of the inventive concepts, the feedback path 509 includes a feedback emulator 510. The feedback emulator 510 is configured to emulate (or match) a frequency response of the feedback path (generally represented as H(f)_1 in FIG. 3) in order to eliminate a modulation correlated error and to allow for leveling of pulse modulation below the sample rate of the feedback path.

In a non-limiting embodiment of the inventive concepts, the loop filter circuit 508, and multiplier 507, the detector conditioning circuit 506, and the feedback emulator 510 of FIG. 3 are digital circuits operating in the digital domain, whereas the remaining elements of FIG. 3 are analog circuits operating in the analog domain. An example of digital circuits that may be adopted is a field programmable gate array (FPGA).

Figure 4:
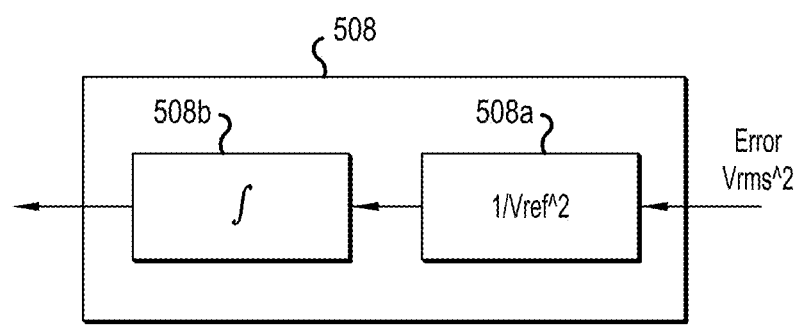
FIG. 4 is a circuit diagram for reference in describing a loop filter and gain linearizer of FIG. 3 according to an embodiment of the inventive concepts.

FIG. 4 is a block diagram showing an example of the loop filter circuit 508 of FIG. 3. As shown in the example of FIG. 4, the loop filter circuit 508 of the illustrated example includes 1/Vref^2 divider 508a and an integrator 508b.

Figure 5:
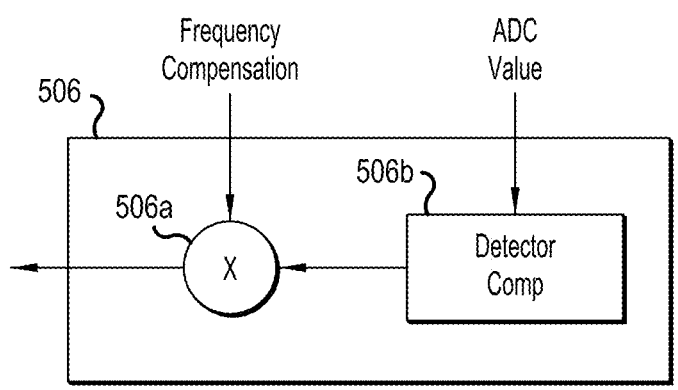
FIG. 5 is a circuit diagram for reference in describing a detector conditioning circuit of FIG. 3 according to an embodiment of the inventive concepts.

FIG. 5 is a block diagram showing an example of the detector conditioning circuit 506. Referring to FIG. 5, in this particular example the low-rate feedback data from the ADC 505 is applied to the compensator 506b which may output a root-mean-square voltage (Vrms^2) corresponding to the digital value of the detected power parameter of the output RF signal. The Vrms^2 voltage is applied to the compensator 506b (such as an amplifier) having a gain controlled by a frequency compensation signal. As mentioned previously, the output of the power detector 504 is not linear relative to changes in RF output signal power. The detector conditioning circuit operates to map the power and volts squared. A look-up table may be used as well. In effect, the detector conditioning circuit 506 transforms the output voltage of the power detector 504 into units suitable for downstream processing. In this respect, it is also noted that power may not be uniform versus frequency. The power/frequency relationship can be modeled as a lookup table or function that has two indices, one being RF frequency and the other being the digitized output voltage of the power detector 504. The output of the lookup table or function would then be a digital value representative of power.

Figure 6:
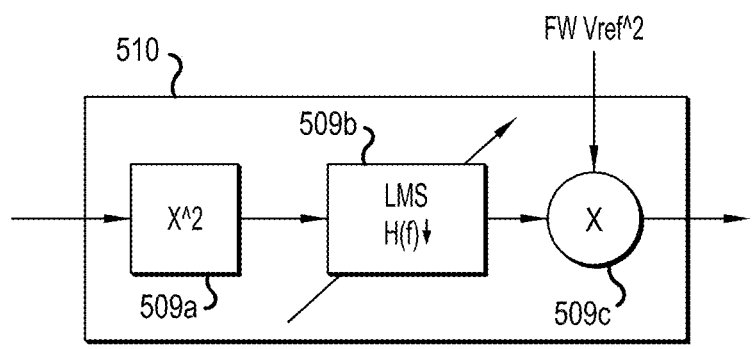
FIG. 6 is a circuit diagram for reference in describing a feedback emulator of FIG. 3 according to another embodiment of the inventive concepts.

FIG. 6 is a block diagram showing an example of the feedback emulator 510 of FIG. 3. In this example, the calibration of the feedforward modulation can be done in real-time in, for example, via an adaptive least-mean-squares (LMS) filter 509b. The feedback emulator 510 of the feedforward path may further include a squaring circuit (x^2) 509a coupled between the input (RF IN) and an input of the LMS adaptive filter 509b, and a multiplier circuit (x) connected to an output LMS adaptive filter 509c and driven by a control signal FW Vref^2. The feedback emulator 510 may be digitally implemented in a field programmable gate array (FPGA).

As previously described a major contribution of the inventive concepts is the calibration of the feedforward path. So, the only thing that necessarily changes may be the filter response before the feedforward error node.

Figure 7:
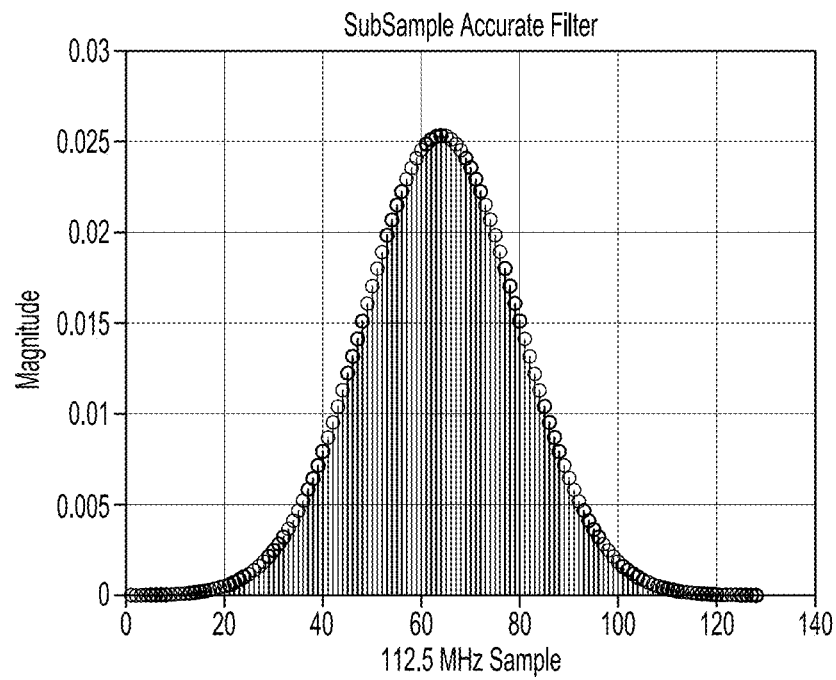
FIGS. 7 and 8 are graphs showing full rate and subsample impulse responses that emulate the ADC filter frequency response to achieve subsample leveling.
Figure 8:
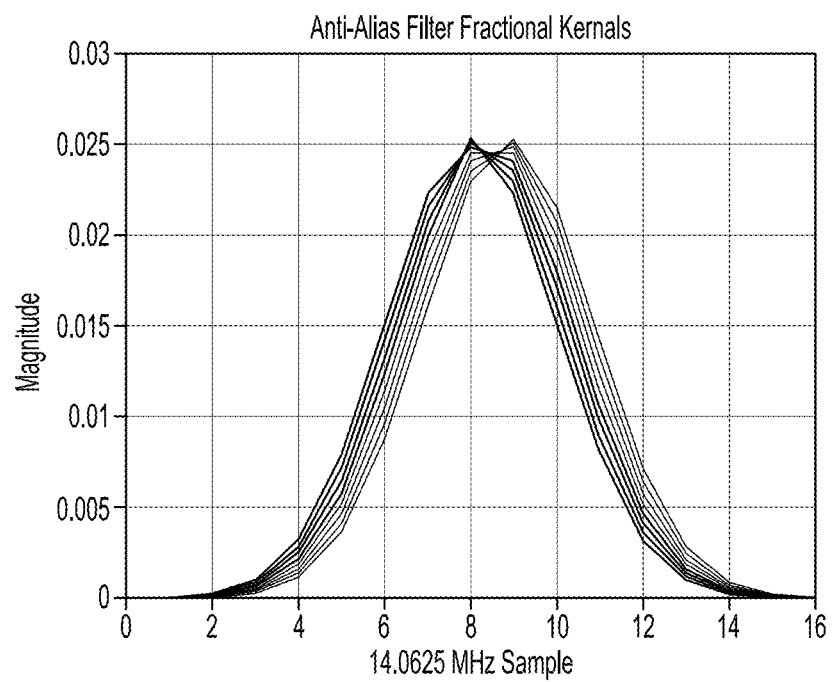

The modulation scheme adopted can be any one of analog modulation, digital modulation, and IQ digital modulation. Also, as previously described, a sampling rate of the ADC may be is less than pulse rate of the RF output or modulation signal. As a specific example, the input rate may be 112.5 MS/s and the ADC sampling rate may be 14.0625 MS/s. In this case, there are 8 different phases of a potential impulse response from the input rate to the output rate. FIGS. 7 and 8 show the full rate and subsample impulse responses that emulate the ADC filter frequency response to achieve subsample leveling. As may be seen, the benefits of subsampling include a decrease in distortion from the ALC itself, and increase in parts availability for the application with low rate, high fidelity ADCs, and the ability to level pulses with narrower widths than the ADC sampler rate.

Figure 9:
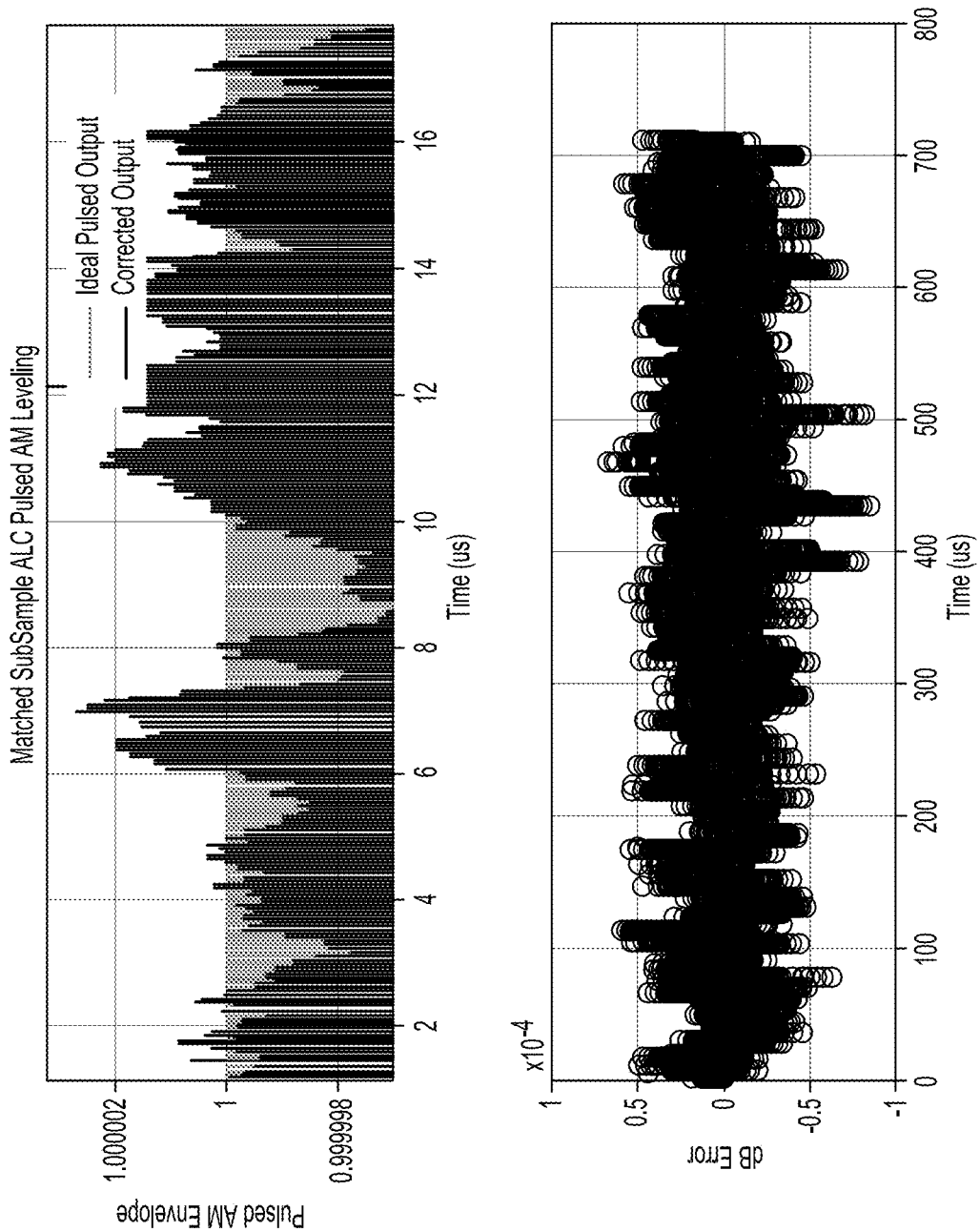
FIG. 9 shows random synchronous pulses modulated into an ALC system in accordance with the inventive concepts.

Another major advancement attendant the inventive concepts is to allow for leveling on pulses much less than the ADC sample rate that previously was not possible. FIG. 9 shows 8.88 ns random synchronous pulses modulated into an ALC system in accordance with the inventive concepts, were a 14.0625 MS/s sample rate is used on the detector (i.e., much lower than the pulse widths). As can be seen in the figure, using the calibrated feedforward, the ALC loop can level pulse modulation 8× narrower than the ADC sample rate by exploiting knowledge of the feed-back frequency response.

It is separately noted that IQ modulation poses a significant challenge. Namely, detector non-linearity, coupler, and pre-output attenuator digital predistortions are all present and must be accounted for since the BW of the waveform may have asymmetries compared to simpler Pulse/Amplitude Modulation. Doing so in the ideal sense requires significant computation. However, there are two main issues, namely, absolute accuracy of ALC with IQ modulation, and distortion from the ALC with IQ modulation. The first problem is solvable with a priori knowledge of the IQ signal paths and calibration via SW calibration of the detector coupler response. The first and second is solvable by performing the correct computation, lowering the ALC BW, and/or some combination of both.

Figure 10:
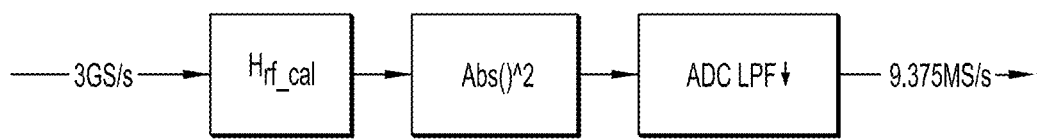
FIG. 10 illustrates an ideal block diagram for calibrating wide-band IQ feedforward according to an embodiment of the inventive concepts.

FIG. 10 illustrates an ideal block diagram for calibrating wide-band IQ feedforward needed for IQ rates. Here the H input filter block is essentially the RF response of the output chain prior to the coupler, the coupler itself, and any IQ predistortions, while the ADC LPF filter is the polyphase decimated response of the anti-alias filter at the input of the ADC. Using Parseval's theorem one can calculate the necessary RF response for the feedforward IQ signal power extremely efficiently, however, the decimation function will impart an unsatisfactory frequency response for perfect match with the detector input response.

$$\frac{1}{N}\sum_{k=0}^{N-1}|X^2(k)| = \sum_{n=0}^{N-1}x^2(n)$$

$$x_{rms} = \sqrt{\frac{1}{N^2}\sum_{k=0}^{N-1}|X^2(k)|} = \sqrt{\frac{1}{N}\sum_{n=0}^{N-1}x^2(n)}$$

$$y_{rms}^2 = \frac{1}{N^2}\sum_{k=0}^{N-1}|X(k)H(k)|^2 = \frac{1}{N}\sum_{n=0}^{N-1}(x(n)*h(n))^2$$

As such the configuration only sufficient to meet the absolute accuracy criteria, while the BW of the ALC will likely need to be lowered somewhat to meet desirable distortion targets.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An automatic level control (ALC) circuit, comprising:
   a modulation input configured to receive a modulation input signal;
   a level control circuit coupled to the modulation input and configured to control a level of a radio-frequency (RF) output signal in response to a feedback signal, the RF output signal modulated according to the modulation signal;
   an output coupled to the level control circuit and configured to output the RF output signal;
   a feedback path coupled to the output and configured to sample the RF output signal to determine an error detected in the RF output signal, and to generate the feedback signal in accordance with the error; and
   a feedforward path coupled to the modulation input and configured to emulate a frequency response in the feedback path and to adjust the error determined in the feedback path according to the emulated frequency response.

2. The ALC circuit of claim 1, wherein a sampling rate of feedback path is less than a signal rate of the modulation signal.

3. The ALC circuit of claim 1, wherein the feedforward path comprises an adaptive filter.

4. The ALC circuit of claim 3, wherein the adaptive filter is a least-mean-square (LMS) adaptive filter.

5. The ALC circuit of claim 4, wherein the feedforward path further comprises a squaring circuit coupled between the input and an input of the LMS adaptive filter, and a multiplier circuit connected to an output LMS adaptive filter.

6. The ALC circuit of claim 5, further comprising a summing circuit configured to sum an output of the multiplier and an output of the feedward path, wherein an output of the summing circuit corresponds to the error as adjusted by the feedward path.

7. The ALC circuit of claim 1, wherein the feedforward path is implemented in a field programmable gate array (FPGA).

8. The ALC circuit of claim 1, wherein the feedback path comprises:
- a detector coupled to the output and configured to detect a power of the RF output signal;
- an analog-to-digital converter configured to digitize an output of the detector; and
- a detector conditioning circuit configured to linearize the output of the detector relative to a power of the RF output signal.

9. The ALC circuit of claim 1, wherein a modulation scheme used to modulate the RF output signal is one of analog modulation, digital modulation and IQ modulation.

* * * * *